United States Patent
Borghetti et al.

(10) Patent No.: US 8,324,976 B2
(45) Date of Patent: Dec. 4, 2012

(54) OSCILLATOR CIRCUITRY HAVING NEGATIVE DIFFERENTIAL RESISTANCE

(75) Inventors: Julien Borghetti, Mountain View, CA (US); Matthew D Pickett, San Francisco, CA (US); Gilberto Medeiros Ribeiro, Palo Alto, CA (US); Wei Yi, Mountain View, CA (US); Jianhua Yang, Palo Alto, CA (US); Minxian Max Zhang, Mountain View, CA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 76 days.

(21) Appl. No.: 13/078,595

(22) Filed: Apr. 1, 2011

(65) Prior Publication Data

US 2012/0249252 A1    Oct. 4, 2012

(51) Int. Cl.
*H03B 7/00*    (2006.01)

(52) U.S. Cl. .................... 331/107 R; 331/132

(58) Field of Classification Search ............... 331/107 R, 331/46, 50, 52, 108 R, 107 G, 107 T, 107 S, 331/132, 187, 111, 143
See application file for complete search history.

(56) References Cited

U.S. PATENT DOCUMENTS

| | | | | |
|---|---|---|---|---|
| 3,054,071 A | * | 9/1962 | Tiemann | 331/107 T |
| 3,249,891 A | * | 5/1966 | Rutz | 331/107 T |
| 8,212,621 B2 | * | 7/2012 | Strachan et al. | 331/2 |

* cited by examiner

*Primary Examiner* — Ryan Johnson
(74) *Attorney, Agent, or Firm* — Scott Gallert

(57) ABSTRACT

Circuitry is provided that closely emulates biological neural responses. Two astable multivibrator circuits (AMCs), each including a negative differential resistance device, are coupled in series-circuit relationship. Each AMC is characterized by a distinct voltage-dependant time constant. The circuitry exhibits oscillations in electrical current when subjected to a voltage equal to or greater than a threshold value. Various oscillating waveforms can be produced in accordance with voltages applied to the circuitry.

20 Claims, 5 Drawing Sheets

OSCILLATOR CIRCUITRY HAVING NEGATIVE DIFFERENTIAL RESISTANCE

GOVERNMENTAL RIGHTS IN THE INVENTION

The invention that is the subject of this patent application was made with Government support under Prime Contract No. HR0011-09-3-0001, through the Defense Advanced Research Projects Agency (DARPA). The Government has certain rights in this invention.

BACKGROUND

Various circuits configured to generate oscillating waveforms are known. These circuits are used in radio equipment, sensors and instrumentation, navigation devices, and a wide range of other applications. Repeating waveforms can be readily generated by way of circuits of corresponding complexity.

However, oscillator circuits having reduced component counts and correspondingly lower production costs are desirable. Additionally, circuits that emulate various natural phenomena are also of interest. The present teachings address the foregoing and other interests.

BRIEF DESCRIPTION OF THE DRAWINGS

The present embodiments will now be described, by way of example, with reference to the accompanying drawings, in which.

DETAILED DESCRIPTION

Introduction

Circuitry and apparatus are provided that closely emulate biological neural responses. Two astable multivibrator circuits are coupled in series-circuit relationship. Each astable multivibrator circuit includes a negative differential resistance (NDR) device. Additionally, each of the astable multivibrator circuits is characterized by a distinct voltage-dependant time constant. The overall circuitry exhibits oscillations in electrical current when subjected to a voltage equal to or greater than a threshold value. Various oscillating waveforms can be produced in accordance with voltages applied to the circuitry.

In one embodiment, an electronic circuit includes a first portion having a first current-controlled NDR device and a first capacitor coupled in parallel-circuit relationship. The first portion is coupled between a first node and a second node of the electronic circuit. The first portion is defined by a first voltage-dependant time constant. The electronic circuit also includes a second portion having a second current-controlled NDR device and a second capacitor coupled in parallel-circuit relationship. The second portion is coupled between the second node and a third node of the electronic circuit. The second portion is defined by a second voltage-dependant time constant that is different than the first voltage-dependant time constant.

In another embodiment, an apparatus includes an electronic circuit. The electronic circuit includes a first astable multivibrator coupled between a first node and a second node. The first astable multivibrator includes a first NDR device. Additionally, the first astable multivibrator is characterized by a first voltage-dependent time constant. The electronic circuit also includes a second astable multivibrator coupled between the second node and a third node. The second astable multivibrator includes a second NDR device. The second astable multivibrator is characterized by a second voltage-dependent time constant that is different than the first voltage-dependent time constant. The electronic circuit is characterized by spike-like oscillations in an electrical current through the first and second astable multivibrators when an electrical potential equal to or greater than a threshold value is present between the first and third nodes.

First Illustrative Circuit

Figure 1:
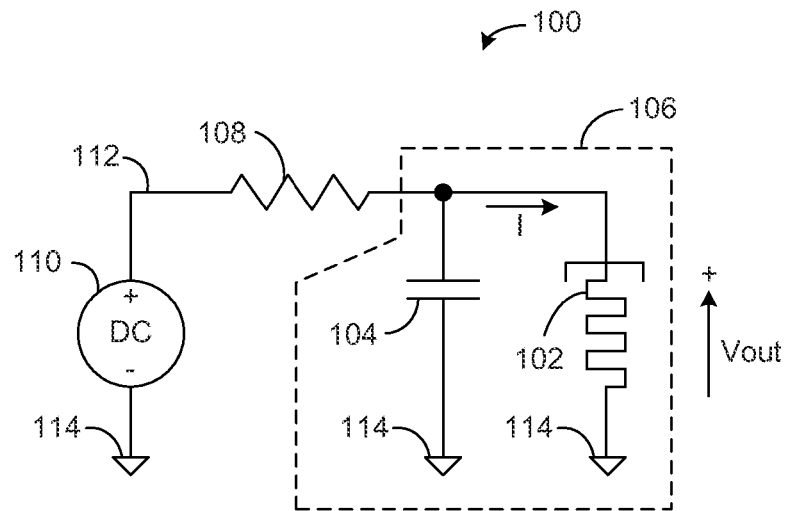
FIG. 1 is a schematic diagram of a circuit according to one example.

Reference is now directed to FIG. 1, which depicts a schematic diagram of a circuit 100. The circuit 100 is illustrative and non-limiting with respect to the present teachings. Thus, other circuits, devices or systems can be configured and/or operated in accordance with the present teachings.

The circuit 100 includes a current-controlled negative differential resistance device 102, referred to hereinafter as an NDR device (or device) 102 in the interest of brevity. In one or more examples, the NDR device 102 is defined by a NDR memory resistor or "memristor". The NDR device 102 is characterized by a switchable non-volatile resistance as well as negative differential resistance. Further discussion of NDR is provided below.

The electrical resistance of the device 102 is selective adjustable by way of applied direct-current (DC) voltages. That is, the electrical resistance of the device 102 can be increased or decreased along a respective response curve by way of corresponding DC potentials. Additional information regarding current-controlled NDR devices and memristors contemplated for use with the present teachings can be found in U.S. patent application Ser. No. 12/837,903, titled "Memristive Negative Differential Resistance Device", as filed 16 Jul. 2010, and naming Matthew D. Pickett as inventor, and which is incorporated herein in its entirety by reference.

The circuit 100 also includes a capacitor 104. In one illustrative and non-limiting example, the capacitor 104 is defined by a capacitance of one picoFarad (i.e., $1 \times 10^{-12}$ Farads). Other capacitors can also be used. The capacitor 104 is coupled in parallel-circuit relationship with the device 102 such that an RC stage 106 is defined. The RC stage 106 is characterized by a voltage-dependent time constant. The circuit 100 is therefore characterized by a voltage-dependant time constant that varies in accordance with an applied DC potential.

The circuit 100 also includes a resistor 108 coupled in series-circuit relationship with the RC stage 106. In one non-limiting example, the resistor 108 is defined by a resistance of ten kiloOhms (i.e., $10 \times 10^3$ Ohms). Other resistors can also be used. In yet one or more other examples, the resistor 108 is omitted. The circuit 100 further includes a source of electrical energy 110. In one example, the energy source 110 is defined by a controllable or variable source of DC voltage. In another example, the energy source 110 is defined by a constant or variable source of DC current. The energy source is coupled between a node 112 and a node 114. Typical normal operations of the circuit 100 are described hereinafter.

Table 1 below includes illustrative and non-limiting examples of constituents of the circuit 100. Other suitable values or elements can also be used in accordance with the present teachings:

TABLE 1

Illustrative Circuit 100

| Element | Value/Identity | Notes/Source |
|---|---|---|
| NDR Device 102 | Memristive NDR | See U.S. 12/837,903 |
| Capacitor 104 | 1.0 pF | (any source) |
| Resistor 108 | 10.0 kOhms | (any source) |
| Energy Source 110 | Variable Current | (any source) |

First Illustrative Response Curve

Figure 2A:
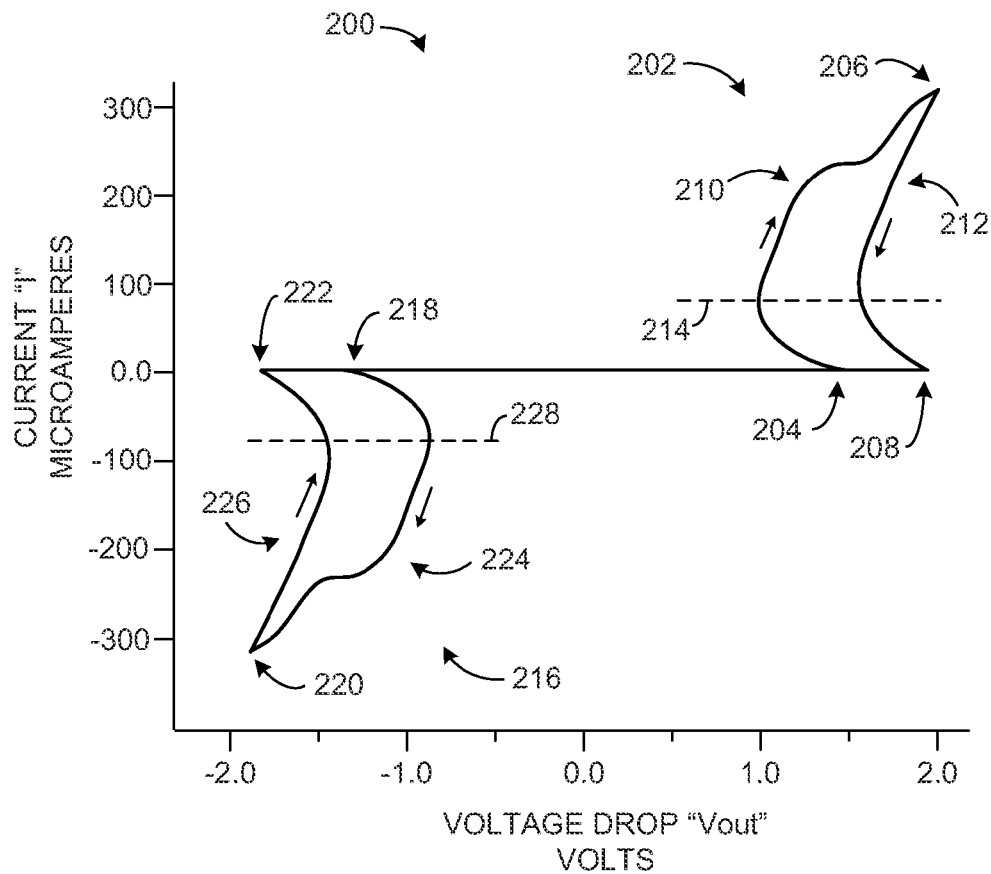
FIG. 2A is a signal response curve illustrating characteristics of a device of the circuit of FIG. 1.

FIG. 2A is a signal diagram depicting a voltage drop "Vout" versus current "I" response curve 200 corresponding to the device 102 of the circuit 100. Voltage drop "Vout" across and current "I" through the device 102 are depicted in FIG. 1 for reference. The response curve 200 is illustrative and non-limiting in accordance with the present teachings. Thus, other embodiments characterized by other response curves are also contemplated by the present teachings.

The response curve 200 includes a portion 202. The portion 202 depicts current flow 'I' through the device 102 corresponding to voltage drops "Vout" of positive polarity. In particular, an increasing applied voltage results in about zero current flow up to a point 204, where after current begins to flow along the response curve 200 toward a point 206. Beyond the point 206, the current "I" switches or "folds back" along the response curve 200 toward a point 208. The device 102 therefore exhibits hysteresis, switching between a "low resistance" operating region 210 and a "high resistance" operating region 212.

Some of the portion 202 is below a memristive switching current threshold level 214. At least some normal operations according to the present teachings are performed at current levels having an absolute value less than the NDR threshold level 214. As long as the current "I" is maintained below the threshold level 214, the device 102 will exhibit NDR but no memristive switching. If the absolute value of the current "I" is brought above the threshold level 214, the memristance of the device 102 will change in a nonvolatile fashion.

The response curve 200 also includes a portion 216. The portion 216 depicts current flow through the device 102 corresponding to voltage drops "Vout" of negative polarity. In particular, a decreasing (i.e., more negative) applied voltage results in about zero current flow up to a point 218, where after current begins to flow along the response curve 200 toward a point 220. Beyond the point 220, the current switches or "folds back" along the response curve 200 toward a point 222. The device 102 switches between a "low resistance" operating region 224 and a "high resistance" operating region 226.

Some of the portion 216 is below (of lesser absolute value than) a memristive switching current threshold level 228. Some normal operations according to the present teachings are performed at current values having an absolute value greater than the NDR threshold level 228. At least some normal operations according to the present teachings are performed at current levels having an absolute value less than the NDR threshold level 228. As long as the current "I" is maintained below the threshold level 228, the device 102 will exhibit NDR but no memristive switching.

If the absolute value of the current "I" is brought above (of greater absolute value than) the threshold level 228, the memristance of the device 102 will change in a nonvolatile fashion. The response curve 200 described above corresponds to behavior exhibited by a device 102 as contemplated by the present teachings. This device 102 behavior is germane to other circuit examples, operations and aspects of the present teachings as described below.

Second Illustrative Response Curve

Figure 2B:
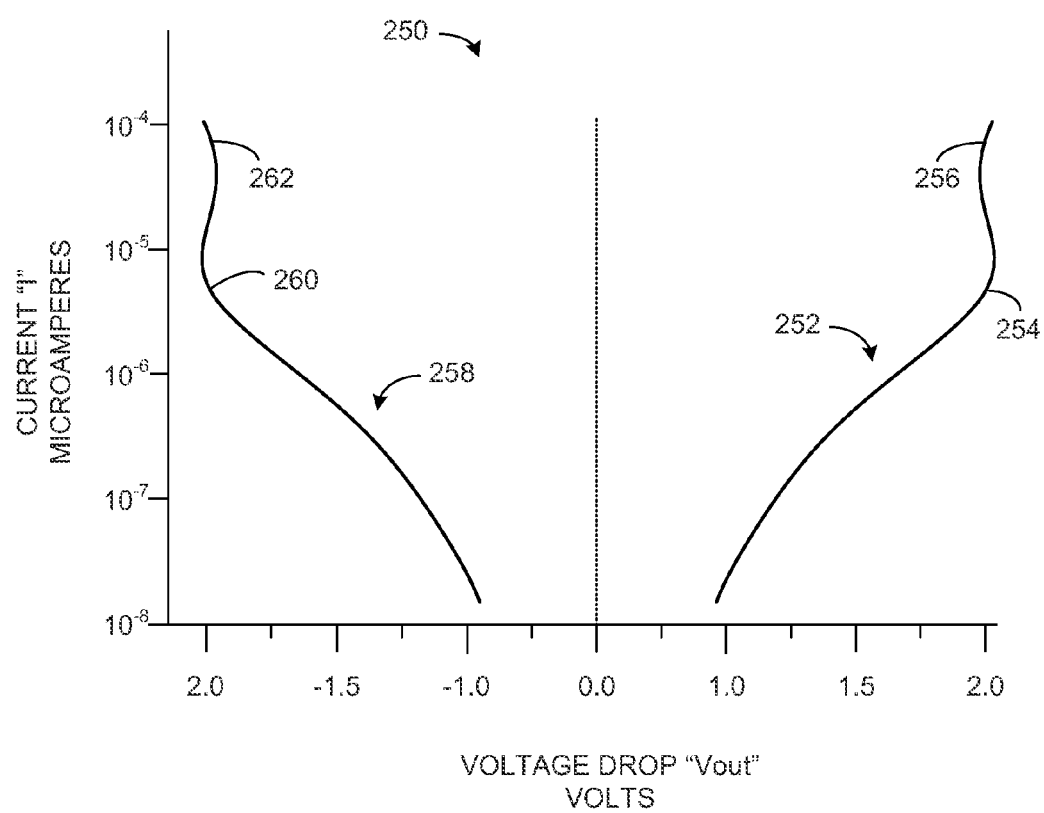
FIG. 2B is signal response curve illustrating negative differential resistance of a device of the circuit of FIG. 1.

Attention is now directed to FIG. 2B, which is a signal diagram depicting voltage drop "Vout" versus current "I" response curve 250 corresponding to the NDR device 102 of the circuit 100. The response curve 250 is non-limiting in accordance with the present teachings, and is illustrative of negative differential resistance of the device 102. Other embodiments characterized by other NDR response curves are also contemplated by the present teachings.

The response curve 250 includes a portion 252. The portion 252 depicts current flow "I" through the NDR device 102 and corresponding voltage drop "Vout" of positive polarity. In particular, an increasing current "I" corresponds to an increasing voltage drop "Vout" in a one-to-one manner, up to a point 254. For current "I" of greater value, the voltage drop "Vout" exhibits a "fold back" or negative resistance characteristic up to about a point 256.

The response curve 250 includes another portion 258. The portion 258 depicts current flow "I" through the NDR device 102 and corresponding voltage drop "Vout" of negative polarity. In particular, an increasing current "I" corresponds to an increasingly negative voltage drop "Vout" in a one-to-one manner, up to a point 260. For current "I" of greater value, the voltage drop "Vout" exhibits a "fold back" or negative resistance characteristic up to about a point 262.

First Illustrative Signal Timing Diagram

Figure 3:
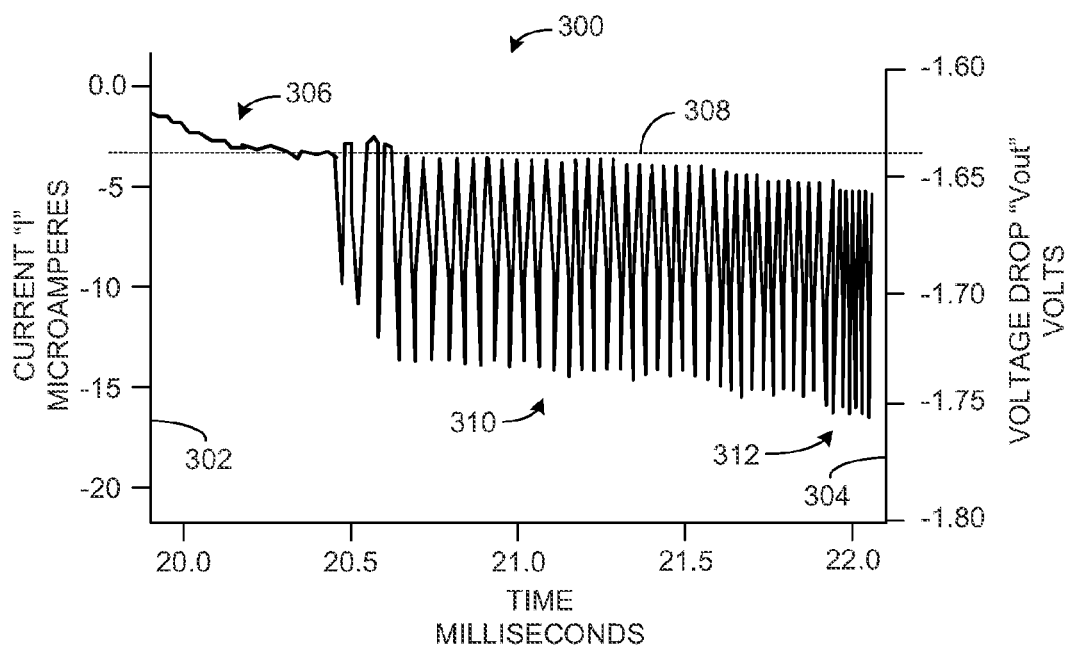
FIG. 3 is a signal timing diagram illustrating operations of the circuit of FIG. 1.

Attention is now directed to FIG. 3, which depicts a signal timing diagram 300 according to one example of the present teachings. The signal timing diagram 300 depicts operations of the circuit 100. The diagram 300 is illustrative and non-limiting in nature. Other signal timing diagrams, corresponding to other circuits and their respective operations, are contemplated by the present teachings.

The diagram 300 depicts an electrical current "I" through and voltage drop Vout across the NDR device 102 of the circuit 100 with respect to time. The instantaneous value of current "I" is determined by reference to a left-side vertical scale 302. The corresponding instantaneous voltage drop "Vout" across the device 102 is determined by reference to a right-side vertical scale 304.

The diagram 300 includes a portion 306 wherein the voltage drop "Vout" is of lesser absolute magnitude than a threshold value 308. Notably, the circuit 100 exhibits no oscillations in either the current "I" or the corresponding voltage drop "Vout" in the portion 306. Thus, the circuit 100 is characterized by a first operating mode wherein no oscillations in current "I" are exhibited. The first operating mode corresponds to applied voltages from the voltage source 110 that are lesser in absolute magnitude than the threshold value 308.

The diagram 300 also includes a portion 310 wherein the voltage drop "Vout" is of equal or greater absolute magnitude than the threshold value 308. The circuit 100 exhibits spike-like oscillations in the current "I" and the corresponding voltage drop "Vout" in the portion 310. The circuit 100 is therefore characterized by a second operating mode wherein the circuit 100 behaves as an astable multivibrator or oscillator.

The second operating mode corresponds to applied voltages from the voltage source 110 that are equal to or greater in absolute magnitude than the threshold value 308. It is also noted that the oscillations increase in frequency in response to increased absolute value of the voltage applied to the circuit 100. This increasing frequency of oscillations in the current "I" is depicted in a portion 312 of the diagram 300.

The diagram 300 is illustrative of normal operations of the circuit 100 according to the present teachings. In general, and without limitation, circuits are contemplated by the present teachings that include an NDR device coupled in parallel-circuit relationship with a capacitor. The corresponding "RC" stage is characterized by a voltage-dependent time constant in accordance with the NDR behavior of the device. Circuits, such as circuit 100 for non-limiting example, exhibit a non-oscillating operating mode and an oscillating operating mode, respectively, in accordance with the magnitude of a voltage applied thereto. Switchover from one operating mode to the other—and back again—occurs in accordance with an applied voltage threshold value exhibited by the particular circuit.

Second Illustrative Circuit

Figure 4:
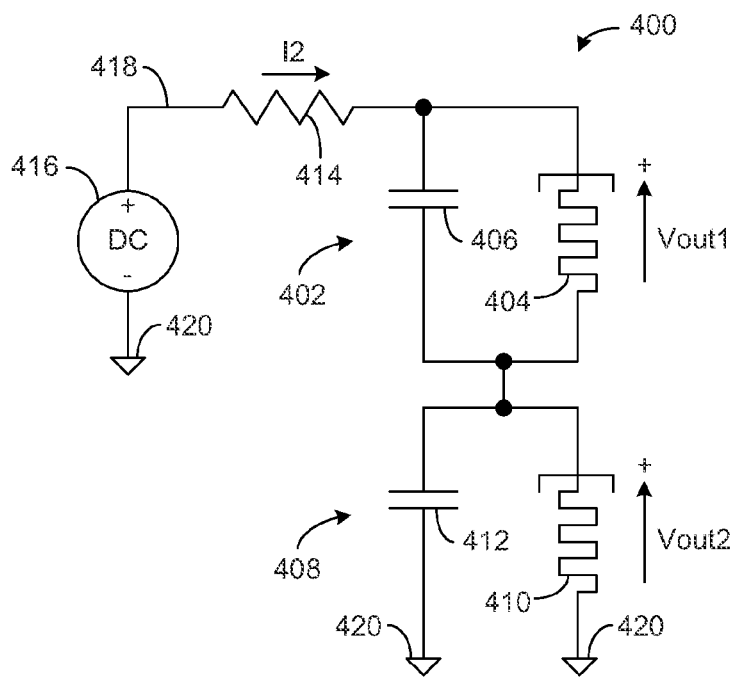
FIG. 4 is a schematic diagram of a circuit according to another example.

Attention is now directed to FIG. 4, which depicts a schematic view of a circuit 400 according to the present teachings. The circuit 400 is illustrative and non-limiting with respect to the present teachings. Thus, other circuits, devices or systems can be configured and/or operated in accordance with the present teachings.

The circuit 400 includes a first stage 402. The first stage 402 includes an NDR device 404 coupled in parallel-circuit relationship with a capacitor 406. The device 404 is characterized by negative differential resistance analogous to that described above. However, it is noted that particular electrical parameters can vary between NDR devices as contemplated herein. The first stage 402 is also referred to as a first multivibrator 402. In one or more examples, the device 404 is defined by a current-controlled NDR memristor.

The first multivibrator 402 is characterized by a first voltage-dependant time constant in accordance with the particular electrical characteristics of the device 404 and capacitor 406. The first multivibrator 402 is also characterized by respective no-oscillating and oscillating operating modes in accordance with an applied voltage-threshold value.

The circuit 400 also includes a second stage 408. The second stage 408 includes an NDR device 410 coupled in parallel-circuit relationship with a capacitor 412. The device 410 is characterized by negative differential resistance analogous to that described above. Again, particular electrical parameters can vary between devices as contemplated herein. The second stage 408 is also referred to as a second multivibrator 408. In one or more examples, the device 410 is defined by a current-controlled NDR memristor.

The second multivibrator 408 is characterized by a second voltage-dependant time constant in accordance with the particular electrical characteristics of the device 410 and capacitor 412. The second multivibrator 408 is also characterized by respective no-oscillating and oscillating operating modes in accordance with an applied voltage-threshold value.

The circuit 400 also includes a resistor 414 coupled in series with the first and second multivibrators 402 and 408. In another example, the resistor 414 is omitted. The circuit 400 further includes a source of electrical energy or energy source 416 coupled between a node 418 and a node 420. In one example, the energy source 416 is defined by a controllable or variable source of DC voltage. In another example, the energy source 416 is defined by a constant or variable source of DC current. Thus, the source of electrical energy 416 can be suitably selected in accordance with the operating goals of the circuit 400.

The first multivibrator 402 is coupled in series-circuit relationship with the second multivibrator 408. In this way, the operating modes of the first and second stages 402 and 408 are interactive. In one or more examples, the respective capacitors 406 and 412 and/or the respective NDR devices 404 and 410 are selected such that the first voltage-dependent time constant is distinct and different than the second voltage-dependent time constant. In one non-limiting example, the first multivibrator 402 is characterized by a time constant of one microsecond at an applied voltage "Vin" of one volt, while the second multivibrator 408 is characterized by a time constant of ten microseconds at an applied voltage "Vin" of one volt.

The illustrative circuit 400 is characterized by a number of operating modes by virtue of the distinct first and second voltage-dependant time constants and the interactive nature of the first and second multivibrators 402 and 408. At least some of these various, illustrative operating modes are described below.

Third Illustrative Circuit

Figure 5:
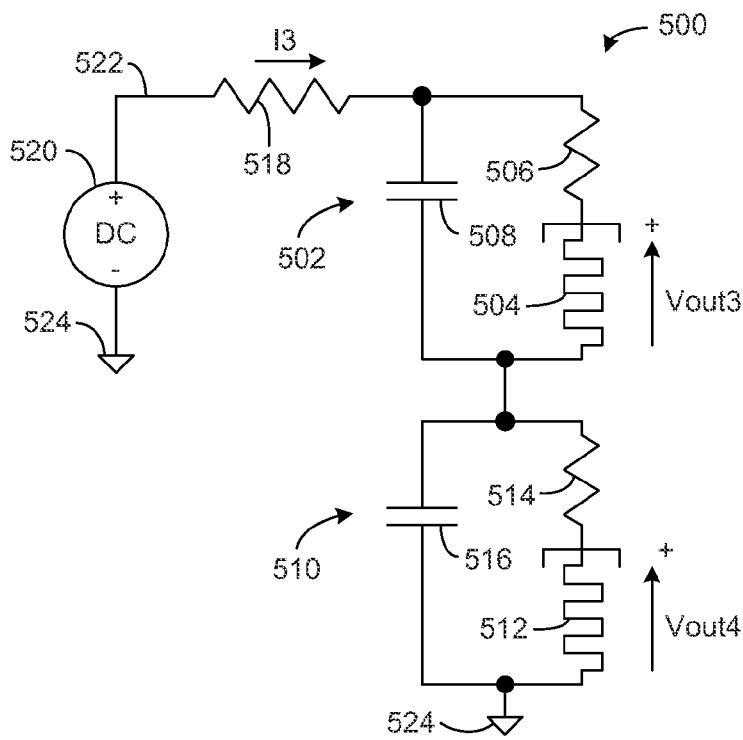
FIG. 5 is a schematic diagram of a circuit according to yet another example.

Attention is turned to FIG. 5, which depicts a schematic view of a circuit 500 according to the present teachings. The circuit 500 is illustrative and non-limiting with respect to the present teachings. Thus, other circuits, devices or systems can be configured and/or operated in accordance with the present teachings.

The circuit 500 includes a first stage 502. The first stage 502 includes an NDR device 504 coupled in series-circuit relationship with a resistor 506. In turn, the device 504 and the resistor 506 are coupled in parallel-circuit relationship with a capacitor 508. The device 504 is characterized by negative differential resistance analogous to that described above. Particular electrical parameters can vary between NDR devices as contemplated herein.

The first stage 502 is also referred to as a first multivibrator 502. The first multivibrator 502 is characterized by a first voltage-dependant time constant in accordance with the particular electrical characteristics of the device 504, the resistor 506 and the capacitor 508. The first multivibrator 502 exhibits respective no-oscillating and oscillating operating modes in accordance with an applied voltage-threshold value.

The circuit 500 also includes a second stage 510. The second stage 510 includes an NDR device 512 coupled in series-circuit relationship with a resistor 514. The device 512 and resistor 514 are coupled in parallel-circuit relationship with a capacitor 516. The device 512 is characterized by negative differential resistance analogous to that described above. The second stage 510 is also referred to as a second multivibrator 510.

The second multivibrator 510 is characterized by a second voltage-dependant time constant in accordance with the particular electrical characteristics of the NDR device 512, the resistor 514 and the capacitor 516. The second multivibrator 510 is characterized by respective no-oscillating and oscillating operating modes in accordance with an applied voltage-threshold value.

The circuit 500 also includes a resistor 518 coupled in series with the first and second multivibrators 502 and 510. In another example, the resistor 518 is omitted. The circuit 500 further includes a source of electrical energy 520. The energy source 520 can be defined by a controllable or variable source of DC voltage, or a constant or variable source of DC current. The energy source is coupled between a node 522 and a node 524.

The first multivibrator 502 is coupled in series-circuit relationship with the second multivibrator 510 such that respective operating modes are interactive. In one or more examples, the respective resistors 506 and 514, the capacitors 508 and 516 and/or the NDR devices 504 and 512 are selected such that the first voltage-dependent time constant is distinct and different than the second voltage-dependent time constant.

The circuit 500 is characterized by a number of operating modes analogous to those described below with respect to the circuit 400. Additionally, the circuit 500 illustrates at least one circuit variation contemplated by the present teachings by virtue of the resistors 506 and 514. Other suitable variations corresponding to additional circuit elements (e.g., capacitors, resistors, inductors, diodes, and so on) are also contemplated.

Second Illustrative Signal Timing Diagram

Figure 6:
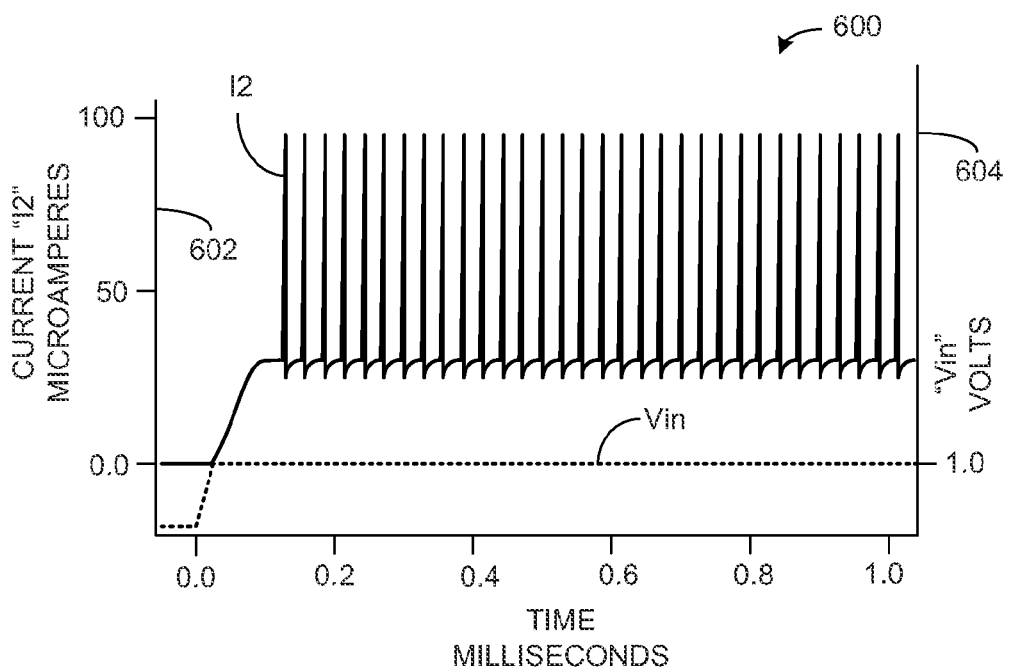
FIG. 6 is a signal timing diagram illustrating operations of the circuit of FIG. 4.

Attention turned to FIG. 6, which depicts a signal timing diagram 600 according to one example of the present teachings. The signal timing diagram (diagram) 600 corresponds to operations of the circuit 400. The diagram 600 is illustrative and non-limiting in nature. Other signal timing diagrams, corresponding to other circuits and their respective operations, are contemplated by the present teachings.

The diagram 600 depicts an electrical current "I2" through the circuit 400 with respect to time. The instantaneous value of current "I2" is determined by reference to a left-side vertical scale 602. An applied voltage "Vin", as applied between nodes 418 and 420, is determined by reference to a right-side vertical scale 604.

The diagram 600 depicts the applied voltage "Vin" beginning in time at or about zero volts and then making a transition to a constant value of one volt at about time zero-point-one milliseconds. In this illustration, a "Vin" value of one volt corresponds to the threshold value for the circuit 400. That is, the respective multivibrators 402 and 408 exhibit oscillations in current there through when the circuit 400 is subjected to one or more volts of applied potential between nodes 418 and 420.

In response, the current "I2" transitions from a zero value to a value of about twenty-five microamperes, lagging the applied voltage "Vin" slightly in time. The current "I2" is thereafter characterized by spike-like oscillations in value between about twenty-five microamperes and about ninety microamperes. The frequency of the oscillations in current "I2" is about constant in correspondence to the constant value of the applied voltage "Vin". The oscillations in current "I2" result in corresponding oscillations in respective voltage drops "Vout1" and "Vout2".

One or both of the respective voltage drops "Vout1" and "Vout2" can be detected by other electronic circuitry (not shown) and amplified, digitally quantified, filtered, and so on, in accordance with any number of contemplated usages. Similarly, the circuit 500 can be operated essentially as described above wherein a current "I3" can be detected by way of corresponding voltage drops "Vout3" and/or "Vout4".

The diagram 600 depicts one illustrative mode of operation of the circuit 400 according to the present teachings. The circuit 400 exhibits behavior that is notably similar to that of a mammalian olfactory neural response. Specifically, an applied voltage "Vin" equal to a threshold value results in spike-like oscillations in current "I2" of about constant frequency. These spike-like current oscillations are analogous to "trigger action" or transmitter release in an olfactory sensory neuron subjected to odorant concentration at a threshold detection level. Additionally, memristive characteristics within the circuit 400 (i.e., NDR device 404 and/or 410) results in behavior similar to that of biological synaptic response.

Third Illustrative Signal Timing Diagram

Figure 7:
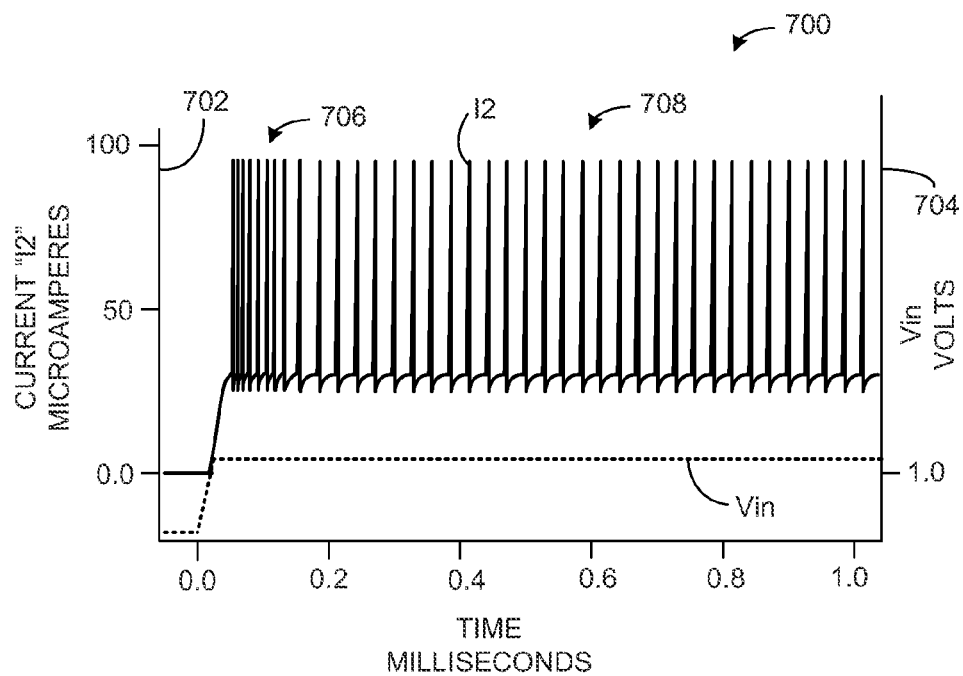
FIG. 7 is a signal timing diagram illustrating other operations of the circuit of FIG. 4.

Attention is directed to FIG. 7, which depicts a signal timing diagram 700 according to one example of the present teachings. The signal timing diagram (diagram) 700 corresponds to operations of the circuit 400. The diagram 700 is illustrative and non-limiting in nature. Other signal timing diagrams, corresponding to other circuits and their respective operations, are contemplated by the present teachings.

The diagram 700 depicts an electrical current "I2" through the circuit 400 with respect to time. The instantaneous value of current "I2" is determined by reference to a left-side vertical scale 702. An applied voltage "Vin", as applied between nodes 418 and 420, is determined by reference to a right-side vertical scale 704.

The diagram 700 depicts the applied voltage "Vin" beginning at or about zero volts, and then making a transition to a constant value of about one-point-two volts just after time zero-point-zero milliseconds. In this illustration, a "Vin" value of one volt corresponds to the threshold value for the circuit 400. Thus, the applied voltage "Vin" has exceeded the threshold value.

In response, the current "I2" transitions from a zero value to a value of about twenty-five microamperes and immediately thereafter exhibits spike-like oscillations in value between about twenty-five microamperes and about ninety microamperes. The frequency of the oscillations in current "I2" are initially relatively high during a time period 706, decreasing toward a steady-state frequency during a time period 708 thereafter.

Thus, the diagram 700 depicts an operating mode for the circuit 400 characterized by an initial transient in current "I2" oscillation frequency due to the greater-than-threshold value of the applied voltage "Vin". In turn, the eventual steady-state value in current "I2" oscillation frequency corresponds to the constant value of the applied voltage "Vin".

The oscillations in current "I2" result in corresponding oscillations in respective voltage drops "Vout1" and "Vout2". The circuit 500 can be operated essentially as described above, wherein current "I3" can be detected by way of voltage drops "Vout3" and/or "Vout4". The diagram 700 depicts another illustrative mode of operation of the circuit 400 according to the present teachings. In particular, an applied voltage "Vin" greater than a threshold value results in spike-like oscillations in current "I2" having a transitory frequency.

Fourth Illustrative Signal Timing Diagram

Figure 8:
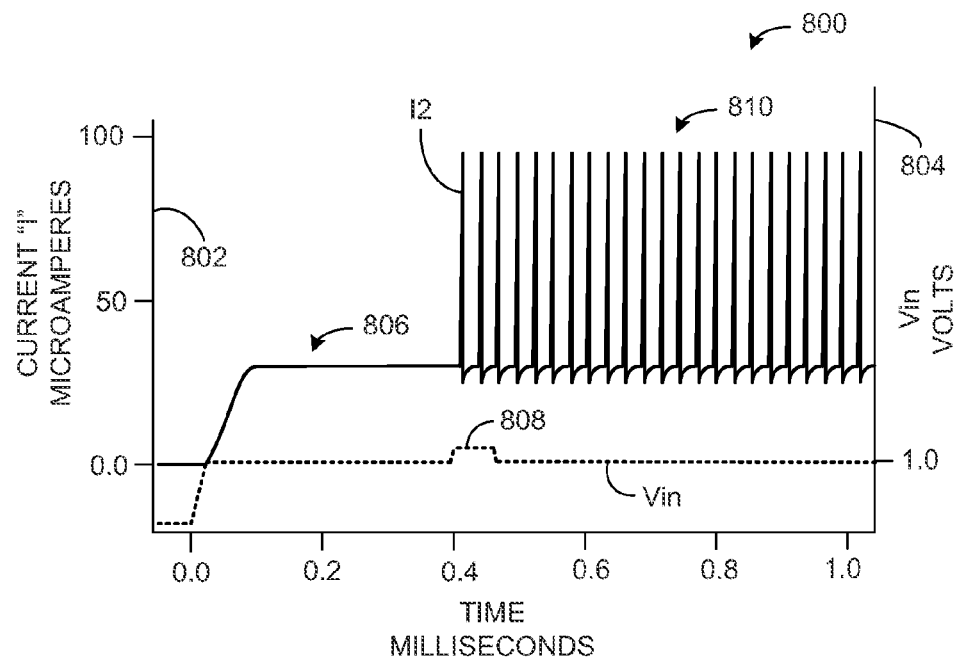
FIG. 8 is a signal timing diagram illustrating still other operations of the circuit of FIG. 4.

Attention is directed to FIG. 8, which depicts a signal timing diagram 800 according to one example of the present teachings. The signal timing diagram 800 corresponds to operations of the circuit 400. The diagram 800 is illustrative and non-limiting in nature. Other signal timing diagrams, corresponding to other circuits and their respective operations, are contemplated by the present teachings.

The diagram 800 depicts an electrical current "I2" through the circuit 400 with respect to time. The instantaneous value of current "I2" is determined by reference to a left-side vertical scale 802. An applied voltage "Vin", as applied between nodes 418 and 420, is determined by reference to a right-side vertical scale 804.

The diagram 800 depicts the applied voltage "Vin" beginning at or about zero volts, and then making a transition to a constant value of about zero-point-nine-five volts just after time zero-point-zero milliseconds and extending to time zero-point-four milliseconds. In this illustration, a "Vin"

value of one volt corresponds to the threshold value for the circuit 400. Thus, the applied voltage "Vin" is slightly lesser than the threshold value.

In response, the current "I2" transitions from a zero value to about twenty-five microamperes and maintains that value consistently up to about time zero-point-four milliseconds, depicted as an initial period 806. The constant, non-oscillating value of current "I2" is due to the slightly lesser than threshold value of the applied voltage "Vin".

Thereafter, the applied voltage "Vin" exhibits a voltage pulse 808 peaking at about one-point-two volts, and then transitioning back to the original value of about zero-point-nine-five volts. In response, the current "I2" is triggered into oscillations, swinging in amplitude between about twenty-five microamperes and about ninety-five microamperes. The oscillations of the current "I2" continue at about a constant frequency thereafter during a period 810.

The diagram 800 depicts an operating mode for the circuit 400 characterized by an initial transient in current "I2" toward a non-oscillating, steady-state value due to the lesser-than-threshold value of the applied voltage "Vin". Another operating mode is then initiated, or triggered, in response to a voltage pulse greater than the threshold value. The oscillations in current "I2" are sustained despite the reduction of applied voltage "Vin" to a value lesser than the threshold value.

The oscillations in current "I2" result in corresponding oscillations in respective voltage drops "Vout1" and "Vout2". The circuit 500 can be operated essentially as described above, wherein current "I3" can be detected by way of voltage drops "Vout3" and/or "Vout4". The diagram 800 depicts another illustrative mode of operation of the circuit 400 according to the present teachings.

In general, the foregoing description is intended to be illustrative and not restrictive. Many embodiments and applications other than the examples provided would be apparent to those of ordinary skill in the art upon reading the above description. The scope of the invention should be determined, not with reference to the above description, but should instead be determined with reference to the appended claims, along with the full scope of equivalents to which such claims are entitled. It is anticipated and intended that future developments will occur in the arts discussed herein, and that the disclosed systems and methods will be incorporated into such future embodiments. In sum, it should be understood that the invention is capable of modification and variation and is limited only by the following claims.

What is claimed is:

1. An electronic circuit, comprising:
   a first portion having a first current-controlled NDR device and a first capacitor coupled in parallel-circuit relationship between a first node and a second node, the first portion defined by a first voltage-dependant time constant; and
   a second portion having a second current-controlled NDR device and a second capacitor coupled in parallel-circuit relationship between the second node and a third node, the second portion defined by a second voltage-dependant time constant different than the first voltage-dependant time constant, at least the first or the second current-controlled NDR device further defined by a memristive current-controlled NDR device.

2. The electronic circuit according to claim 1, the first portion defining a first astable multivibrator, the second portion defining a second astable multivibrator.

3. The electronic circuit according to claim 1 the first portion including a resistor coupled in series-circuit relationship with the first current-controlled NDR device.

4. The electronic circuit according to claim 1, the second portion including a resistor coupled in series-circuit relationship with the second current-controlled NDR device.

5. The electronic circuit according to claim 1, characterized by an operating mode including no oscillations in a non-zero electrical current flow through the first and second portions when a voltage lesser than a threshold value is present between the first and third nodes.

6. The electronic circuit according to claim 1 further comprising a source of electrical energy coupled to at least the third node.

7. The electronic circuit according to claim 6 further comprising a resistor coupled in series-circuit relationship between the source of electrical energy and the first node.

8. An apparatus including an electronic circuit, the electronic circuit comprising:
   a first astable multivibrator coupled between a first node and a second node, the first astable multivibrator including a first NDR device, the first astable multivibrator characterized by a first voltage-dependent time constant; and
   a second astable multivibrator coupled between the second node and a third node, the second astable multivibrator including a second NDR device, the second astable multivibrator characterized by a second voltage-dependent time constant different than the first voltage-dependent time constant, the electronic circuit characterized by spike-like oscillations in an electrical current through the first and second astable multivibrators when an electrical potential equal to or greater than a threshold value is present between the first and third nodes.

9. The apparatus according to claim 8, the electronic circuit further characterized by an about constant electrical current flow through the first and second astable multivibrators when a non-zero electrical potential lesser than the threshold value is present between the first and third nodes.

10. The apparatus according to claim 8, at least the first or the second astable multivibrator including a capacitor coupled in parallel relationship with the first or second NDR device, respectively.

11. The apparatus according to claim 8, at least the first or the second NDR device being further defined by a memristive current-controlled NDR device.

12. The apparatus according to claim 8, at least the first or the second astable multivibrator including a resistor coupled in series relationship with the first or second NDR device, respectively.

13. The apparatus according to claim 8 further comprising a variable source of electrical energy coupled to at least the third node.

14. An electronic circuit, comprising:
   a first portion having a first current-controlled NDR device and a first capacitor coupled in parallel-circuit relationship between a first node and a second node, the first portion defined by a first voltage-dependant time constant; and
   a second portion having a second current-controlled NDR device and a second capacitor coupled in parallel-circuit relationship between the second node and a third node, the second portion defined by a second voltage-dependant time constant different than the first voltage-dependant time constant, the electronic circuit characterized by an operating mode including oscillations in an electrical current flow through the first and second portions when a voltage equal to or greater than a threshold value is present between the first and third nodes.

15. The electronic circuit according to claim 14, the first portion defining a first astable multivibrator, the second portion defining a second astable multivibrator.

16. The electronic circuit according to claim 14, the first portion including a resistor coupled in series-circuit relationship with the first current-controlled NDR device.

17. The electronic circuit according to claim 14, the second portion including a resistor coupled in series-circuit relationship with the second current-controlled NDR device.

18. The electronic circuit according to claim 14, characterized by an operating mode including no oscillations in a non-zero electrical current flow through the first and second portions when a voltage lesser than a threshold value is present between the first and third nodes.

19. The electronic circuit according to claim 14 further comprising a source of electrical energy coupled to at least the third node.

20. The electronic circuit according to claim 19 further comprising a resistor coupled in series-circuit relationship between the source of electrical energy and the first node.

* * * * *

UNITED STATES PATENT AND TRADEMARK OFFICE
CERTIFICATE OF CORRECTION

| | | |
|---|---|---|
| PATENT NO. | : 8,324,976 B2 | Page 1 of 1 |
| APPLICATION NO. | : 13/078595 | |
| DATED | : December 4, 2012 | |
| INVENTOR(S) | : Julien Borghetti et al. | |

It is certified that error appears in the above-identified patent and that said Letters Patent is hereby corrected as shown below:

In the Claims:

In column 10, line 1, in Claim 3, delete "claim 1" and insert -- claim 1, --, therefor.

Signed and Sealed this
Fourteenth Day of May, 2013

Teresa Stanek Rea
*Acting Director of the United States Patent and Trademark Office*